(12) United States Patent
Tung et al.

(10) Patent No.: US 6,885,025 B2
(45) Date of Patent: Apr. 26, 2005

(54) ORGANIC LIGHT EMITTING DEVICE STRUCTURES FOR OBTAINING CHROMATICITY STABILITY

(75) Inventors: Yeh-Jiun Tung, Princeton, NJ (US); Michael Lu, Lawrenceville, NJ (US); Raymond C. Kwong, Plainsboro, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 10/618,160

(22) Filed: Jul. 10, 2003

(65) Prior Publication Data

US 2005/0006641 A1 Jan. 13, 2005

(51) Int. Cl.[7] .............................................. H01L 51/00
(52) U.S. Cl. ........................... 257/40; 257/40; 257/642
(58) Field of Search ......................... 257/40, 642, 643, 257/648, 759, 760; 438/22; 428/90

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,312,836 B1 * | 11/2001 | Bulovic et al. | 428/690 |
| 6,337,102 B1 | 1/2002 | Forrest et al. | |
| 6,468,819 B1 | 10/2002 | Kim et al. | |
| 6,528,188 B1 | 3/2003 | Suzuki et al. | |
| 6,548,956 B1 | 4/2003 | Forrest et al. | |
| 2002/0106530 A1 | 8/2002 | Ishibashi et al. | |
| 2003/0068524 A1 | 4/2003 | Hatwar | |

OTHER PUBLICATIONS

US 5,703,736, 12/1997, Forrest et al. (withdrawn)
Baldo et al., "Highly Efficient Phosphorescent Emission from Organic Electroluminescent Devices", Nature, vol. 395, 151–154 (1998).
Baldo et al. "Very High–Efficiency Gren Organic Light–Emitting Devices Based on Electrophosphorescence", Appl. Phys. Lett., vol. 75, No. 3, 4–6 (1999).
Adachi et al., "Nearly 100% Internal Phosphorescent Efficiency In An Organic Light Emitting Device", J. Appl. Phys., 90, 5048 (2001).
Zhou et al., "High–efficiency electrophosphorescent organic light–emitting diodes with double light–emitting layers", Appl. Phys. Lett., vol. 81, No. 21, 4070–4072 (Nov. 18, 2002).

* cited by examiner

*Primary Examiner*—David Nelms
*Assistant Examiner*—Thinh T Nguyen
(74) *Attorney, Agent, or Firm*—Kenyon & Kenyon

(57) ABSTRACT

The present invention relates to organic light emitting devices (OLEDs). The devices of the present invention are efficient white or multicolored phosphorescent OLEDs which have a high color stability over a wide range of luminances. The devices of the present invention comprise an emissive region having at least two emissive layers, with each emissive layer comprising a different host and emissive dopant, wherein at least one of the emissive dopants emits by phosphorescence.

17 Claims, 17 Drawing Sheets

Figure 17
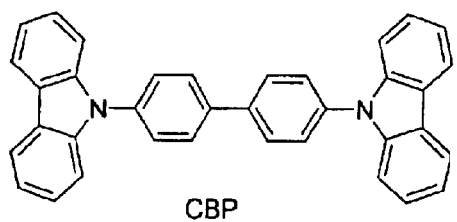
CBP
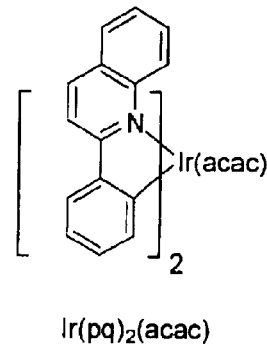
Ir(pq)₂(acac)
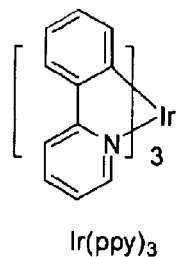
Ir(ppy)₃
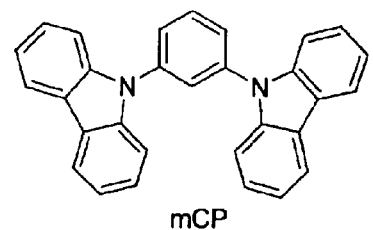
mCP
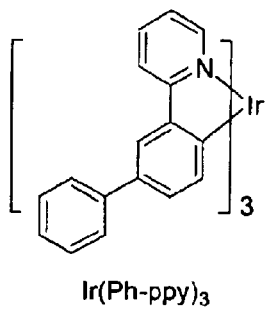
Ir(Ph-ppy)₃
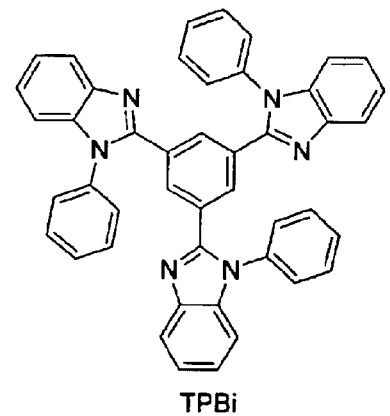
TPBi
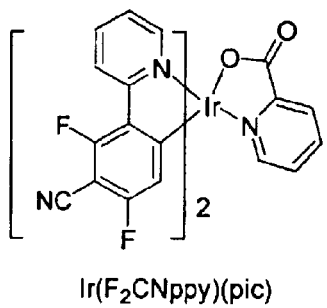
Ir(F₂CNppy)(pic)
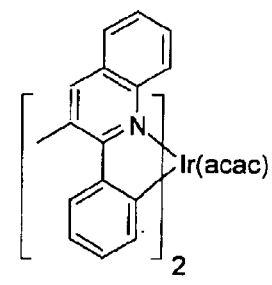
Ir(Me-pq)₂(acac)

US 6,885,025 B2

ORGANIC LIGHT EMITTING DEVICE STRUCTURES FOR OBTAINING CHROMATICITY STABILITY

GOVERNMENT RIGHTS

This invention was made with Government support under Contract No. DE-FG02-02ER83565 awarded by the Department of Energy. The government has certain rights in this invention.

RESEARCH AGREEMENTS

The claimed invention was made by, on behalf of, and/or in connection with one or more of the following parties to a joint university-corporation research agreement: Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs), and more specifically to efficient phosphorescent OLEDs. Particularly, the present invention relates to OLEDs having multiple emissive dopants with a device structure that provides high color-stability of the light emission over a wide range of currents or luminances.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices, organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic device. For example, a transparent electrode material, such as indium tin oxide (ITO), may be used as the bottom electrode. A transparent top electrode, such used in a top-emitting device, as disclosed in U.S. Pat. Nos. 5,703,436, 5,707,745 and 6,548,956, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

The quality of white illumination sources can be fully described by a simple set of parameters. The color of the light source is given by its CIE chromaticity coordinates x and y (1931 2-degree standard observer CIE chromaticity). The CIE coordinates are typically represented on a two dimensional plot. Monochromatic colors fall on the perimeter of the horseshoe shaped curve starting with blue in the lower left, running through the colors of the spectrum in a clockwise direction to red in the lower right. The CIE coordinates of a light source of given energy and spectral shape will fall within the area of the curve. Summing light at all wavelengths uniformly gives the white or neutral point, found at the center of the diagram (CIE x,y-coordinates, 0.33, 0.33). Mixing light from two or more sources gives light whose color is represented by the intensity weighted average of the CIE coordinates of the independent sources. Thus, mixing light from two or more sources can be used to generate white light.

The approach used to generate white OLEDs described previously typically involves separating different emissive dopants (typically three different emitters are doped into individual layers). In this approach, the individual dopants are segregated into separate layers, wherein the host material for each layer is the same. Kido, J. et. al. *Science*, 267, 1332–1334 (1995). The design of such a device can be complicated, since careful control of the thickness and composition of each layer is critical for achieving good color balance. Additionally, these devices suffered from lower efficiency and low color stability as a function of current drive. As the current density is increased, the zone of electron-hole recombination can shift. This results in a device having an emission that changes as a function of drive current. Thus, for example, white emitting devices prepared according to this approach may appear as a balanced white emitting only at a narrow range of drive currents.

SUMMARY OF THE INVENTION

[0012] An organic light emitting device is provided. The devices of the present invention are efficient white or multicolored phosphorescent OLEDs which have a high color stability over a wide range of luminances. The devices of the present invention comprise an emissive region having at least two emissive layers, with each emissive layer comprising a different host and dopant.

In one embodiment of the present invention, the devices comprise an emissive region disposed between and electrically connected to an anode and a cathode, wherein the emissive region comprises (i) a first emissive layer, comprising a first host material and a first emissive material, and (ii) a second emissive layer in physical contact with the first emissive layer and comprising a second host material and a second emissive material. The first emissive layer is nearer to the anode than the second emissive layer, and at least one of the first emissive material or the second emissive material is a phosphorescent emissive material. The contact between the first emissive layer and the second emissive layer provides an electron injection barrier, a hole injection barrier, or both.

In another embodiment of the present invention, the devices comprise an emissive region disposed between and electrically connected to an anode and a cathode, wherein the emissive region comprises (i) a first emissive layer, comprising a first host material and a first emissive material, (ii) a second emissive layer comprising a second host material and a second emissive material, and (iii) a blocking layer between and in contact with the first emissive layer and the second emissive layer. The blocking layer may be an electron blocking layer or a hole blocking layer, and at least one of the first emissive material or the second emissive material is a phosphorescent emissive material.

BRIEF DESCRIPTION OF THE DRAWINGS

FIG. 17 shows the chemical structures of CBP, Ir(pq)$_2$ (acac), Ir(Ppy)$_3$, mCP, Ir(Ph-ppy)$_3$, TPBi, Ir($F_2$CNppy)$_2$ (pic), and Ir(Me-pq)$_2$(acac).

DETAILED DESCRIPTION

Figure 1:
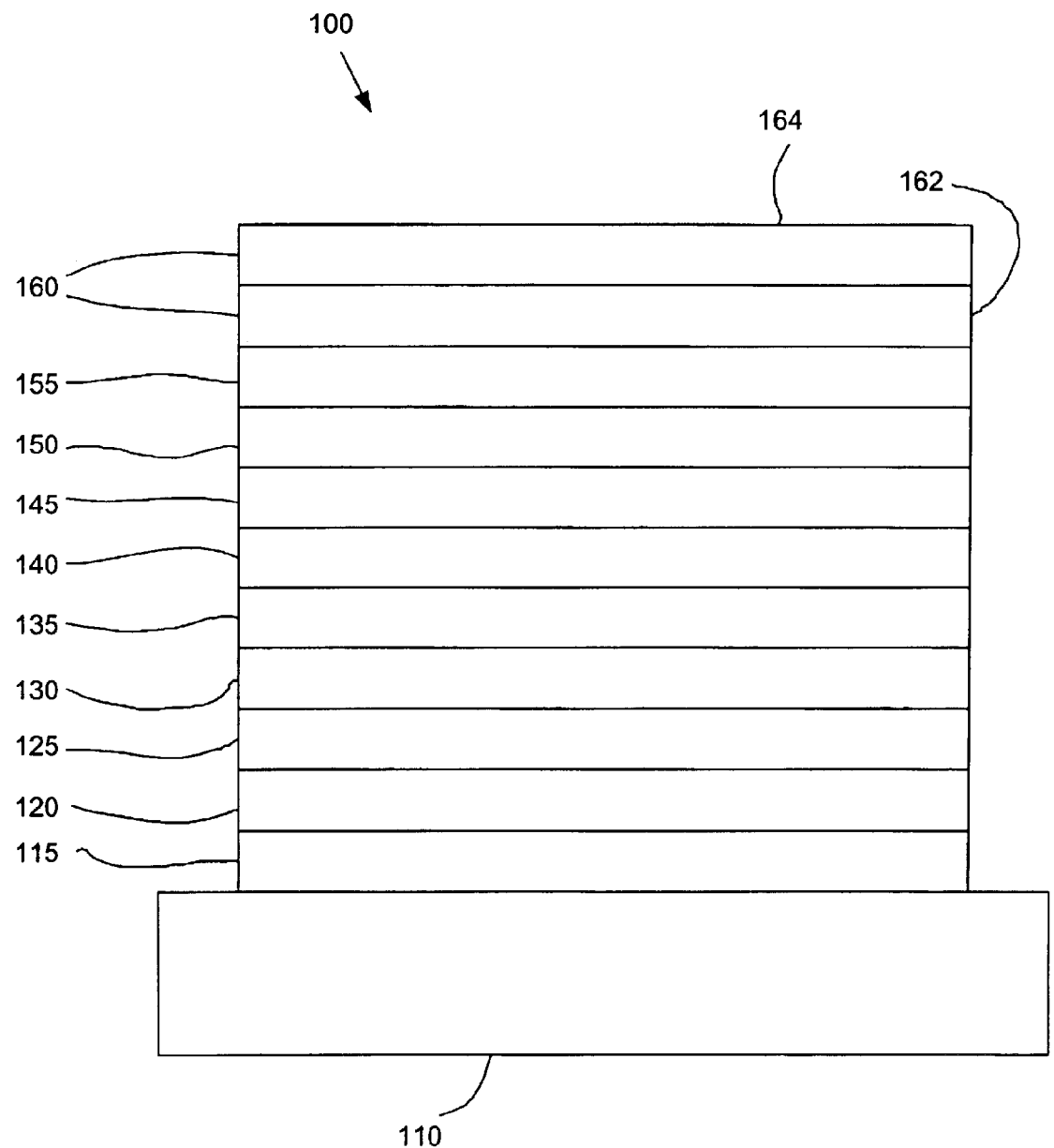
FIG. 1 shows an organic light emitting device having separate electron transport, hole transport, and emissive layers, as well as other layers.

The present invention provides efficient white or multicolored phosphorescent OLEDs which have a high color stability over a wide range of luminances. The devices of the present invention comprise an emissive region having at least two adjacent emissive layers, with each emissive layer comprising a different host and a dopant. The different host materials of the adjacent emissive layers are selected so as to provide a "heterojunction" between the emissive layers that localizes recombination of electrons and holes at or near the heterojunction. The heterojunction provides a narrow zone of recombination which does not shift significantly as a function of the drive current applied to the device. The resulting devices display a high color stability as a function of drive current.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151–154, 1998; ("Baldo-I") and Baldo et al., "Very high-efficiency green organic light-emitting devices based on electrophosphorescence," Appl. Phys. Lett., vol. 75, No. 3, 4–6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that a material that exhibits phosphorescence at liquid nitrogen temperatures may not exhibit phosphorescence at room temperature. But, as demonstrated by Baldo, this problem may be addressed by selecting phosphorescent compounds that do phosphoresce at room temperature.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive region 135, a hole blocking layer 140, an electron transport layer 145, an electron injection layer 150, a protective layer 155, and a cathode 160. Cathode 160 may be a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 10 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. No. 5,844,363, which is incorporated by reference in its entirety. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. 4,4'-Bis[N-(1-naphthyl)-N-phenyl-amino]biphenyl (α-NPD) and as N,N'-diphenyl-N,N'-bis(3-methylphenyl)1-1'biphenyl-4,4'diamine (TPD) are examples of intrinsic hole transport layers. An example of a p-doped hole transport layer is m-MTDATA doped with $F_4$-TCNQ at a molar ratio of 50:1, as disclosed in U.S. patent application Ser. No. 10/173,682 to Forrest et al., which is incorporated by reference in its entirety. Other hole transport layers may be used.

Emissive region 135 is comprised of at least two adjacent emissive layers, each of which includes an organic material capable of emitting light when a current is passed between anode 115 and cathode 160. At least one of the emissive materials should be a phosphorescent emissive material. Preferably, each emissive layer contains a phosphorescent emissive material, although fluorescent emissive materials may also be used. Phosphorescent materials are preferred because of the higher luminescent efficiencies associated with such materials. An emissive layer may comprise other materials, such as dopants that tune the emission of the emissive material. An emissive layer may include a plurality of emissive materials capable of, in combination, emitting a desired spectrum of light. Examples of phosphorescent emissive materials include $Ir(ppy)_3$. Examples of fluorescent emissive materials include DCM and DMQA. Examples of phosphorescent emissive materials are disclosed in U.S. Pat. No. 6,303,238 to Thompson et al., which is incorporated by reference in its entirety. The emissive material may be included in an emissive layer in a number of ways. For example, an emissive small molecule may be incorporated into a polymer.

Electron layer 145 may include a material capable of transporting electrons. Electron transport layer 145 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in U.S. patent application Ser. No. 10/173, 682 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) level of the electron transport layer. In this case, the "charge carrying component" is the material responsible for the LUMO that actually transports electrons. This component may be the base material, or it may be a dopant. The LUMO level of an organic material may be generally characterized by the electron affinity of that material and the relative electron injection efficiently of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and doped metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436, 5,707,745 and 6,548,956 disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive region. An electron blocking layer 130 may be disposed between emissive region 135 and the hole transport layer 125, to inhibit electrons from leaving emissive region 135 in the direction of hole transport layer 125. Similarly, a hole blocking layer 140 may be disposed between emissive region 135 and electron transport layer 145, to inhibit holes from leaving emissive region 135 in the direction of electron transport layer 140. Blocking layers may also be used to inhibit excitons from diffusing out of the emissive region. The theory and use of blocking layers is described in more detail in U.S. Pat. No. 6,097,147 and U.S. patent application Ser. No. 10/173,682 to Forrest et al., which are incorporated by reference in their entireties. Blocking layers can serve one or more blocking functions. For example, a hole blocking layer can also serve as an exciton blocking layer. In some embodiments, the hole blocking layer does not simultaneously serve as an emissive layer in devices of the present invention. Blocking layers can be thinner than carrier layers. Typical blocking layers have a thickness ranging from about 50 Å.

An electron blocking layer functions to confine electrons to specific regions of the light emitting devices. For example, device efficiency can be increased if electrons are inhibited from migrating out of the emissive region. Electron blocking layers are comprised of materials that have difficulty acquiring electrons (i.e., are relatively difficult to reduce). In the context of a light emitting device, electron blocking layers are preferably more difficult to reduce than the adjacent layer from which electrons migrate. A material that is more difficult to reduce than another material generally has a higher LUMO energy level. As an example, electrons originating from the cathode and migrating into an emissive layer can be inhibited from exiting the emissive layer (on the anode side) by placing a blocking layer adjacent to the anode side of the emissive where the blocking layer has a LUMO energy level higher than the LUMO energy level of the emissive layer. Larger differences in LUMO energy levels correspond to better electron blocking ability. The LUMO of the materials of the blocking layer are preferably at least about 300 meV, or more, above the LUMO level of an adjacent layer in which electrons are to be confined. In some embodiments, the LUMO of the materials of the blocking layer can be at least about 200 meV above the LUMO level of an adjacent layer in which holes are to be confined.

Electron blocking layers may also be good hole injectors. Accordingly, the HOMO energy level of the electron blocking layer is preferably close to the HOMO energy level of the layer in which electrons are to be confined. It is preferable that differences in HOMO energy levels between the two layers is less than the differences in LUMO energies, leading to a lower barrier for migration of holes across the interface than for the migration of electrons form the emissive layer into the electron blocking layer. Electron blocking layers that are also good hole injectors typically have smaller energy barriers to hole injection than for electron leakage. Accordingly, the difference between the HOMO energies of the electron blocking layer and the layer in which electrons are to be confined (corresponding to an hole injection energy barrier) is smaller than the difference in their LUMO energies (i.e., electron blocking energy barrier).

As would be generally understood by one skilled in the art, use of the term "blocking" layer is meant to suggest that the layer is comprised of a material, or materials, that provide a barrier that significantly inhibits transport of charge carriers and/or excitons through the layer, without suggesting or implying that the barrier completely blocks all charge carriers and/or excitons. The presence of such a barrier typically manifests itself in terms of producing substantially higher efficiencies as compared to devices lacking the blocking layer, and/or in terms of confining the emission to the desired region of the OLED.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. In this case, the "charge carrying component" is the material responsible for the HOMO that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials may be further distinguished from conventional hole transporting materials that are typically used in the hole transporting layer of an OLED in that such HIL materials may have a hole conductivity that is substantially less than the hole conductivity of conventional hole transporting materials. The thickness of the HIL may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
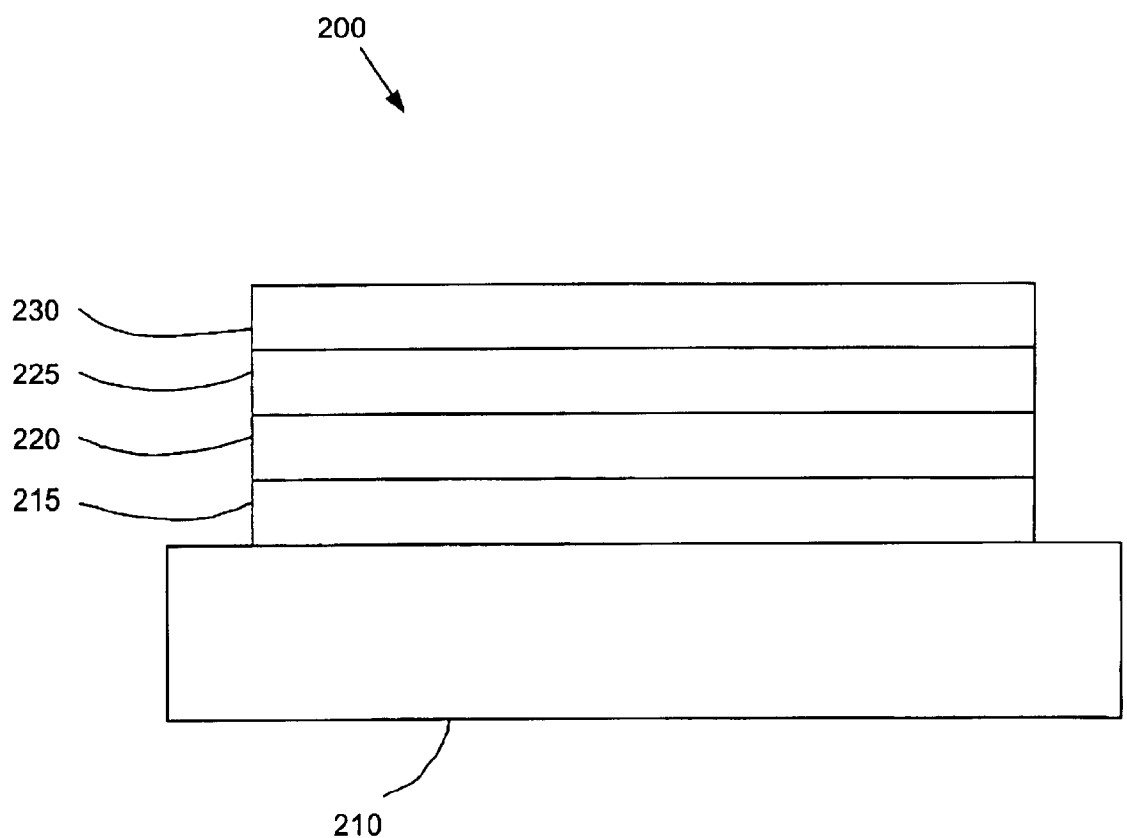
FIG. 2 shows an inverted organic light emitting device that does not have a separate electron transport layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

Figure 3:
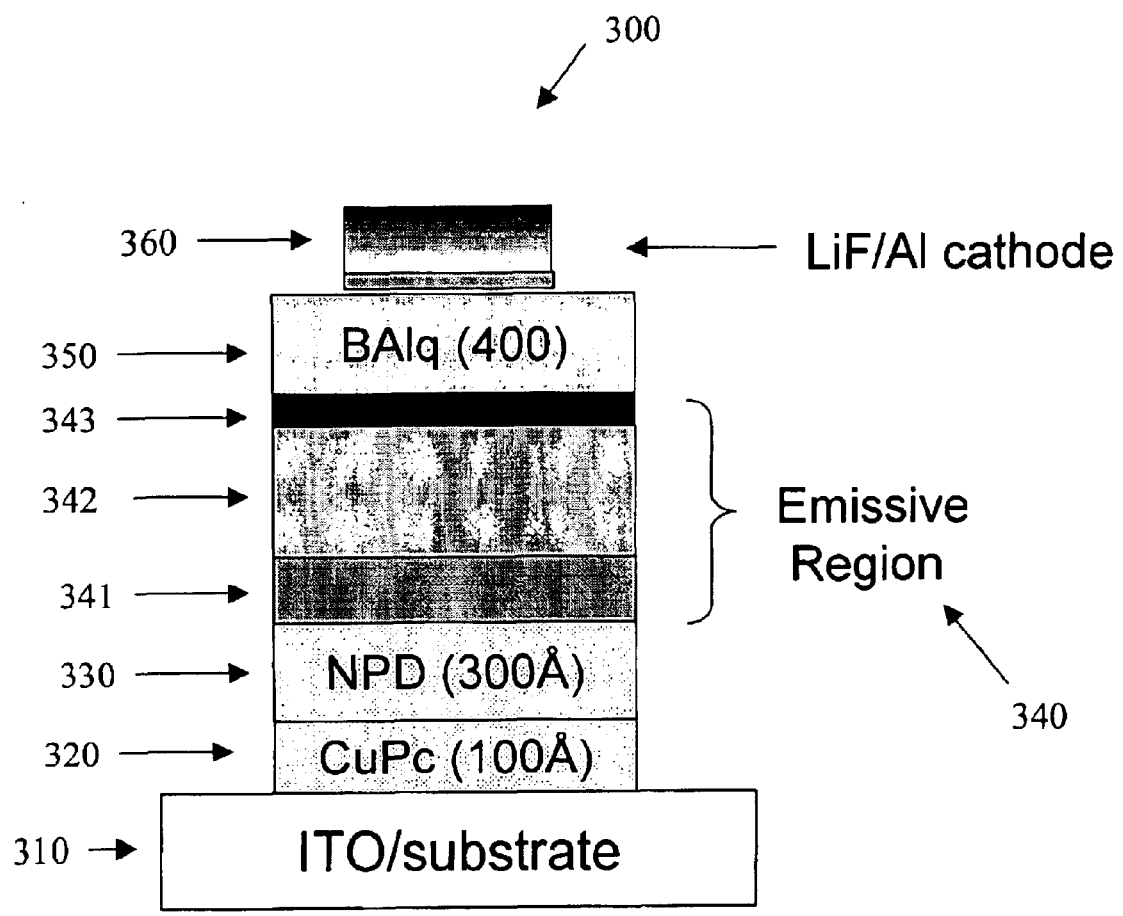
FIG. 3 shows an organic light emitting device having the device structure ITO/CuPc(100 Å)/NPD(300 Å)/Emissive Region/BAlq(400 Å)/LiF(5 Å)/Al(100 Å).

FIG. 3 shows an organic light emitting device having the device structure 300. Device 300 includes an anode 310, a hole injection layer 320, a hole transport layer 330, an emissive region 340, an electron transport layer 350, and a cathode 360. The emissive region is comprised of the individual emissive layers 341, 342 and 343. The layers 310, 320, 330, 350 and 360 are labeled with exemplary materials suitable for use in the respective layers.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive region 220, and may be described as a hole transport layer or a hole injection layer. In one embodiment, an OLED may be described as having an "organic layer" disposed between a cathode and an anode. This organic layer may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3–20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20–25 degrees C.).

As used herein, "solution processible" means capable of being dissolved, dispersed, or transported in and/or deposited from a liquid medium, either in solution or suspension form.

The devices of the present invention comprise an emissive region, wherein the emissive region has at least two adjacent emissive layers, a first emissive layer and a second emissive layer. In one embodiment, each emissive layer comprising a different host material and at least one emissive dopant material. The first emissive layer is in physical contact with the second emissive layer and is nearer to the anode than the second emissive layer. The first emissive layer is comprised of a first host material and a first emissive material, and the second emissive layer is comprised of a second host material and a second emissive material. The first host material and the second host material are different chemical compounds. The different host materials of the adjacent emissive layers are selected so as to provide a "heterojunction" between the emissive layers that localizes recombination of electrons and holes at or near the heterojunction. The heterojunction provides a narrow zone for the recombination of electrons and holes which does not shift significantly as a function of the drive current applied to the device. Recombination occurs primarily at or near the heterojunction and the resulting excitons may diffuse to both sides of the heterojunction. As the emissive layers the form the heterojunction contain different emissive dopants, the device emission spectrum contains the electroluminescence from multiple emissive materials.

The devices of the present invention display a high color stability as a function of luminance. Preferably, the CIE x,y-coordinates vary by only about 0.04 ($\Delta$x+0.04, $\Delta$y+0.04) over a wide luminance range. More preferably, the CIE x,y-coordinates vary by less than about 0.02 ($\Delta$x±0.02, $\Delta$y±0.02) over a wide luminance range. Even more preferably, the CIE x,y-coordinates vary by less than about 0.01 ($\Delta$x±0.01, $\Delta$y±0.01) over a wide luminance range. It is preferred that the wide luminance range be at least a range of about 1000 cd/m$^2$ to about 20,000 cd/m$^2$. More preferably, the devices display a high color stability over the luminance range of about 50 cd/m$^2$ to about 50,000 cd/m$^2$.

In one embodiment, the heterojunction between the adjacent emissive layers of the emissive region provides an electron injection barrier. In this case, electrons are inhibited from crossing the heterojunction between the emissive layers. Electrons, originating at the cathode, are transported through the emissive layer on the cathode-side of the junction (the "second" emissive layer). The host materials of the emissive layers that form the heterojunction are selected such that electrons, upon reaching the heterojunction, are inhibited from transport into or through the emissive layer on the anode-side of the junction (the "first" emissive layer). This may be achieved by selecting the different host materials of the emissive layers that form the heterojunction based on the relative LUMOs of the two host materials. The host material of the emissive layer on the anode-side of the heterojunction is selected to have a LUMO that is higher than the host material of the emissive layer on the cathode-side of the heterojunction. The difference in the LUMO levels of the first and second emissive layer should preferably be at least 0.25 eV, more preferably at least 0.3 eV, and even more preferably at least 0.7 eV. In another embodiment, the emissive layer on the anode-side of the junction may have a lower electron mobility than the emissive layer on the cathode-side of the junction.

In another embodiment of the invention, the heterojunction between the adjacent emissive layers of the emissive region provides a hole injection barrier. In this case, holes are inhibited from crossing the heterojunction between the emissive layers. Holes, originating at the anode, are transported through the emissive layer on the anode-side of the junction (the "first" emissive layer). The host materials of the emissive layers that form the heterojunction are selected such that holes, upon reaching the heterojunction, are inhibited from transport into or through the emissive layer on the cathode-side of the junction (the "second" emissive layer). This may be achieved by selecting the different host materials of the emissive layers that form the heterojunction based on the relative HOMOs of the two host materials. The host material of the emissive layer on the cathode-side of the heterojunction is selected to have a HOMO that is lower than the host material of the emissive layer on the anode-side of the heterojunction. The difference in the HOMO levels of the first and second emissive layer should preferably be at least 0.25 eV, more preferably at least 0.3 eV, and even more preferably at least 0.7 eV. In another embodiment, the emissive layer on the cathode-side of the junction may have a lower hole mobility than the emissive layer on the cathode-side of the junction.

In a further embodiment of the invention, the heterojunction may display any combination of the properties that work to localize recombination at or near the heterojunction. For example, the heterojunction may provide both an electron injection barrier and a hole injection barrier.

The electronic properties of the host materials (for example, when the host is an undoped thin layer) are believed be a good approximation of the electronic properties of the doped layer. Thus, for example, the electron mobility of the doped layer is approximated by the electron mobility of the host material. In the case of phosphorescent dopants, which are generally present at a concentration of about 6%, the dopant itself may contribute to the electronic properties of the doped layer. In the cases where the phosphorescent dopant does contribute to the electronic properties of the layer, it may be useful to describe the properties (e.g., LUMO, HOMO, electron mobility, hole mobility, etc.) as being a property of the doped layer.

In another embodiment of the invention, the recombination zone is localized in the emissive region by the use of a blocking layer between the two emissive layers. In this embodiment the emissive region is comprised of a first emissive layer, comprising a first host material and a: first emissive material, a second emissive layer comprising a second host material and a second emissive material, and a blocking layer between and in contact with the first emissive layer and the second emissive layer. The blocking layer may be an electron blocking layer or a hole blocking layer.

The emissive region may be comprised of additional emissive layers. In a preferred embodiment of the invention, the emissive region has three emissive layers. The use of three emissive layers is particularly preferred for the construction of white-emitting devices. Two of the adjacent emissive layers form the heterojunction as described above (the first and second emissive layers). An additional emissive layer may be adjacent to either the emissive layer on the cathode-side of the junction or the emissive layer on the anode-side of the heterojunction. The additional layer may be comprised of a host material and an emissive dopant. Preferably, the emissive dopant emits at a different frequency than the emissive dopants of the two emissive layers that form the heterojunction. The host material for this layer may be the same or different from the host materials of the two emissive layers that form the heterojunction.

In a preferred embodiment, one of the emissive dopants will be selected from a phosphorescent blue-emitting dopant (peak emission wavelength in the range from about 430 nm to about 470 nm). When the emissive dopant is selected from a phosphorescent blue-emitting dopant, a high energy-gap host, or "wide gap host" may be preferred as the host material for the blue-emitting layer. The wide gap host may have an energy gap that is greater than 3.0 eV. In preferred embodiments of the invention, the emissive material is selected to emit radiation with an emission peak in the high energy, blue region of the visible spectrum. A charge carrying dopant may be employed in addition to an emissive dopant in the emissive layer.

The HOMO and LUMO energy levels for organic materials to be used in OLEDs have been estimated in several ways. The two common methods for estimating HOMO levels are solution electrochemistry and ultraviolet photoelectron spectroscopy (UPS). The two common methods for estimating LUMO levels are solution electrochemistry and inverse photoemission spectroscopy. These energies are useful for predicting the interactions described herein between the emissive material and the host material of the emissive layer. Additionally, the alignment of the HOMO and LUMO levels between adjacent layers will control the passage of hole and electrons between the two layers.

The most common method for determining oxidation and reduction potentials is cyclic voltammetry. A simple description of this process is as follows. The unknown is dissolved along with a high concentration of electrolyte. Electrodes are inserted and the voltage scanned in either the positive or negative direction (depending on whether an oxidation or reduction is being performed). The presence of a redox reaction is indicated by current flowing through the cell. The voltage scan is then reversed and the redox reaction is reversed. If the areas of the two redox waves are the same the process was reversible. The potential at which these events occur give the value of the reduction or oxidation potential relative to a reference. The reference can be an external electrode, such as Ag/AgCl or SCE, or it can be an internal one, such as ferrocene, which has a known oxidation potential. The latter is often preferred for organic solvents, since the common reference electrodes are water based. Although this is a solution process, in contrast to the solid state OLED, and the reference may be hard to adjust to give values relative to vacuum, the method is good for giving relative numbers. One useful parameter that may come from electrochemical measurement is the carrier gap. If both the reduction and oxidation are reversible, one can determine the energy difference between the hole and the electron (i.e. taking an electron out of the HOMO versus putting one into the LUMO). This value is important to determine the LUMO energy from a well defined HOMO energy. If either of the redox processes are not reversible, the carrier gap cannot be determined by this method.

The preferred method to estimate HOMO energies in the solid state is UPS. This is a photoelectric measurement, where the solid is irraditated with UV photons. The energy of the photons is gradually increased until photogenerated electrons are observed. The onset of ejected electrons gives the energy of the HOMO. The photons at that energy have just enough energy to eject an electron form the top of the filled levels. Inverse photoemission involves pre-reducing the sample and then probing the filled states to estimate the LUMO energies. The best accepted method for determining HOMO energies is UPS, which gives values in eV relative to vacuum. This is the binding energy for the electron.

Another important parameter is the optical gap. This value is typically determined from the intersection of the normalized absorption and emission spectra. For a molecule that has very little structural rearrangement in the excited state, the gap between the absorption and emission $\lambda_{max}$ values is rather small and this intersection energy is a good estimate of the optical gap (the 0—0 transition energy). This is often held to be the HOMO-LUMO gap. In some cases, this can be a poor estimation if the shift between the absorption and emission maxima is large (Stokes shift), such that the optical gap is hard to determine. If there is a structural rearrangement in the excited state or the absorption that is measured is not the one for the lowest energy excited state, then there can be a large error. Alternatively, the edge of the absorption or emission bands may be used to estimate the optical gap. In some cases, this is a poor estimate. When the optical gap is used to estimate LUMO energies from a measured HOMO energy, it is most useful for a well behaved molecule (i.e. a small Stokes shift), where it is close to the HOMO-LUMO gap. Even in this case, a carrier gap may be a better estimate and may be larger than the optical gap. If one is concerned about exciton blocking, the edge of the absorption band is more useful, as this will give the energy below which excitons will not be efficiently trapped. That is to say, if an exciton of lower energy than the band edge of the materials approaches a layer with a higher energy absorption edge the likelihood that the exciton will be transferred into this material is low. For molecules emitting from triplet excited states, the absorption edge is the best estimate, since the intersystem crossing may lead to a very large Stokes shift.

A first energy level (HOMO or LUMO) is considered "less than" or "lower" than a second energy level if it is lower on a conventional energy level diagram, which means that the first energy level would have a value that is more negative than the second energy level. A first energy level (HOMO or LUMO) is considered "higher" than a second energy level if it is higher on a conventional energy level diagram, which means that the first energy level would have a value that is less negative than the second energy level. For example, the HOMO of CBP −5.32 eV and the HOMO of TPBi is −5.70 eV, therefore the HOMO of CBP is 0.38 eV "higher" than the HOMO of TPBi. Similarly, the LUMO of mCP is −0.77 eV and the LUMO of CBP is −1.23 eV, therefore the LUMO of mCP is 0.46 eV "higher" than the LUMO of CBP. The above values were determined using density functional calculations performed using the Spartan 02 software package, available from Wavefunction Inc. of Irvine, Calif., at the B3LYP/6–31G* level. A pseudo potential option can be used for species containing heavy metals such as Ir(ppy)$_3$. Density functional calculations have been demonstrated in the literature to be able to qualitatively predict energies of organic and inorganic compounds.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions:

As used herein, abbreviations refer to materials as follows:

CBP: 4,4'-N,N-dicarbazole-biphenyl
m-MTDATA 4,4',4"-tris(3-methylphenylphenlyamino) triphenylamine
Alq$_3$: 8-tris-hydroxyquinoline aluminum
Bphen: 4,7-diphenyl-1,10-phenanthroline
n-BPhen: n-doped BPhen (doped with lithium)
F$_4$-TCNQ: tetrafluoro-tetracyano-quinodimethane
p-MTDATA: p-doped m-MTDATA (doped with F$_4$-TCNQ)
Ir(ppy)$_3$ or Irppy: tris(2-phenylpyridine)-iridium
Ir(ppz)$_3$: tris(1-phenylpyrazoloto,N,C(2')iridium(III)
BCP: 2,9-dimethyl-4,7-diphenyl-1,10-phenanthroline
TAZ: 3-phenyl-4-(1'-naphthyl)-5-phenyl-1,2,4-triazole
CuPc: copper phthalocyanine.
ITO: indium tin oxide
NPD: naphthyl-phenyl-diamine
TPD: N,N'-bis(3-methylphenyl)-N,N'-bis-(phenyl)-benzidine
BAlq: aluminum(III)bis(2-methyl-8-quinolinato)4-phenylphenolate
mCP: 1,3-N,N-dicarbazole-benzene
DCM: 4-(dicyanoethylene)-6-(4-dimethylaminostyryl-2-methyl)-4H-pyran
DMQA: N,N'-dimethylquinacridone
PEDOT:PSS: an aqueous dispersion of poly(3,4-ethylenedioxythiophene) with polystyrenesulfonate (PSS)
Ir(4,6-F$_2$ ppy)$_2$(BPz$_4$) iridium(III) bis(2-(4,6-difluorphenyl) pyridinato-N,C$^2$)η$^2$-N,N'-(tetrakis(1-pyrazolyl)borate)
Ir(pq)$_2$(acac) (2,4-pentanedionato-κO,κO')bis[2-(2-quinolinyl-κN)phenyl-κC]iridium
Ir(Me-pq)$_2$(acac) bis[2-(3-methyl-2-quinolinyl-κN)phenyl-κC](2,4-pentanedionato-κO,κO') iridium
Ir(F$_2$CNppy)$_2$(pic) Bis[2-(4,6-difluoro-5-cyanophenyl) pyridine]Iridium(III)picolinate
Ir(Ph-ppy)$_3$ Iridium(III)tris-[2-(3-biphenyl)pyridine]
TPBi 2,2',2"-(1,3,5-benzenetriyl)tris-(1-phenyl-1H-benzimidazole)

EXPERIMENTAL

Specific representative embodiments of the invention will now be described, including how such embodiments may be made. It is understood that the specific methods, materials, conditions, process parameters, apparatus and the like do not necessarily limit the scope of the invention.

Where available, solvents and reagents were purchased from Aldrich Chemical Company. The reagents were of the highest purity and used as received. Octaphenyl-polyhedral oligomeric silsesquioxane was purchased from Hybrid Plastics.

mCP was prepared by the palladium-catalyzed cross coupling of aryl halides and arylamines. (T. Yamamoto, M. Nishiyama, Y. Koie *Tet. Lett.*, 1998, 39, 2367–2370).

Device Fabrication

Prior to device fabrication, indium tin oxide (ITO) on glass was patterned as 2 mm wide stripes (sheet resistance 20 Ω/□). The substrates were cleaned by sonication in soap solution, rinsing with deionized water, boiled in trichloroethylene, acetone and ethanol for 3–4 min in each solvent. After the cleaning procedure, the substrates were dried under an $N_2$ flow followed by UV ozone treatment for 10 min.

Organic layers of the OLEDs were sequentially deposited by thermal evaporation from resistively heated tantalum boats onto the substrates, at room temperature, at a base pressure of ~3–4×10⁻⁶ Torr, at 2.5 Å/s. The rate of a single-component layer was controlled with one Inficon thickness monitor located close to the substrate. For the two-component emissive layer the rate of the dopant was controlled with an additional crystal monitor located close to the dopant evaporation source. The additional monitor was not exposed to the major flow of the host, which allowed increasing the precision of the dopant concentration.

The devices were encapsulated and characterized after fabrication. Current-voltage measurements were made with a Keithley source meter (model 2400). Spectra and light intensity were measured using a PhotoResearch 705 Model Spectrophotometer and calibrated photodiode.

Example 1

Figure 4:
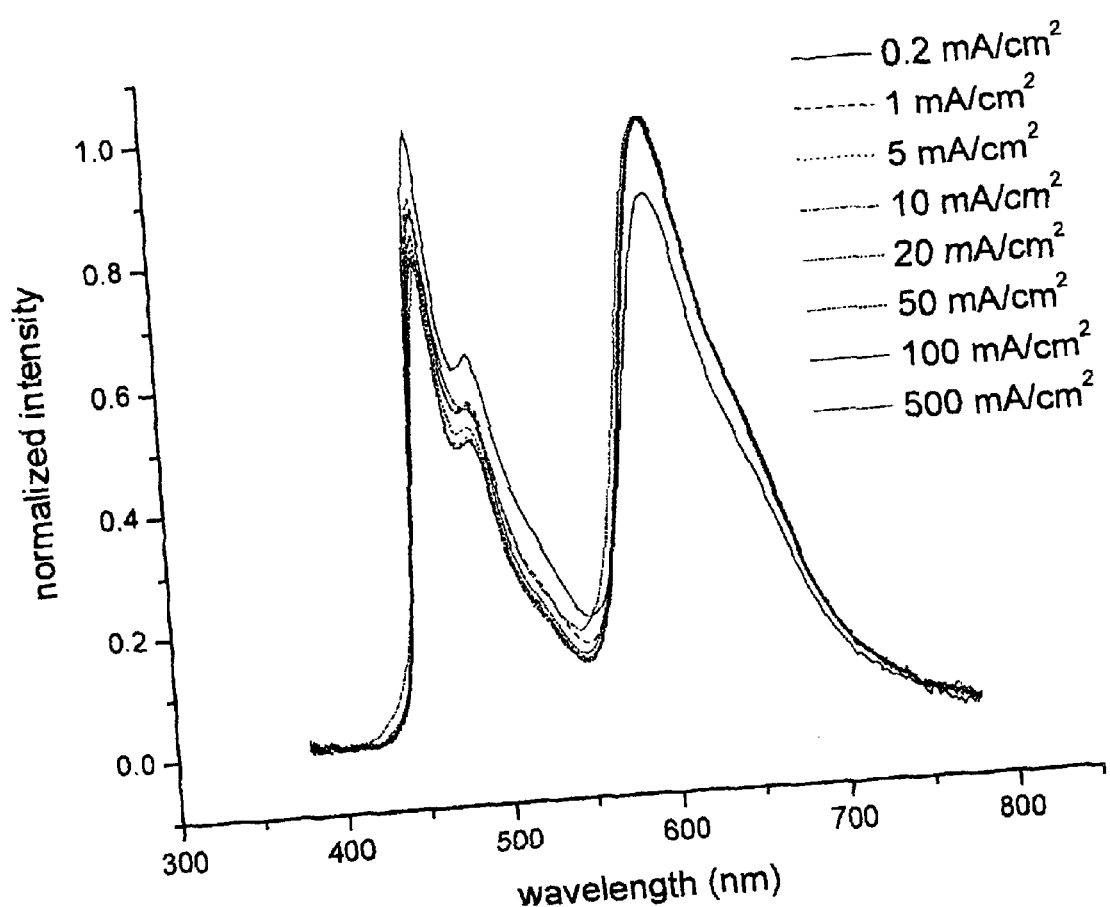
FIG. 4 shows the plots of the normalized emission spectra at various current densities for a device of FIG. 3 were the Emissive Region has the structure CBP:Irppy(6%, 50 Å)/mCP:Ir($F_2$CNppy)$_2$(pic)(6%, 200 Å)/CBP:Ir(pq)$_2$(acac) (6%, 50 Å).
Figure 5:
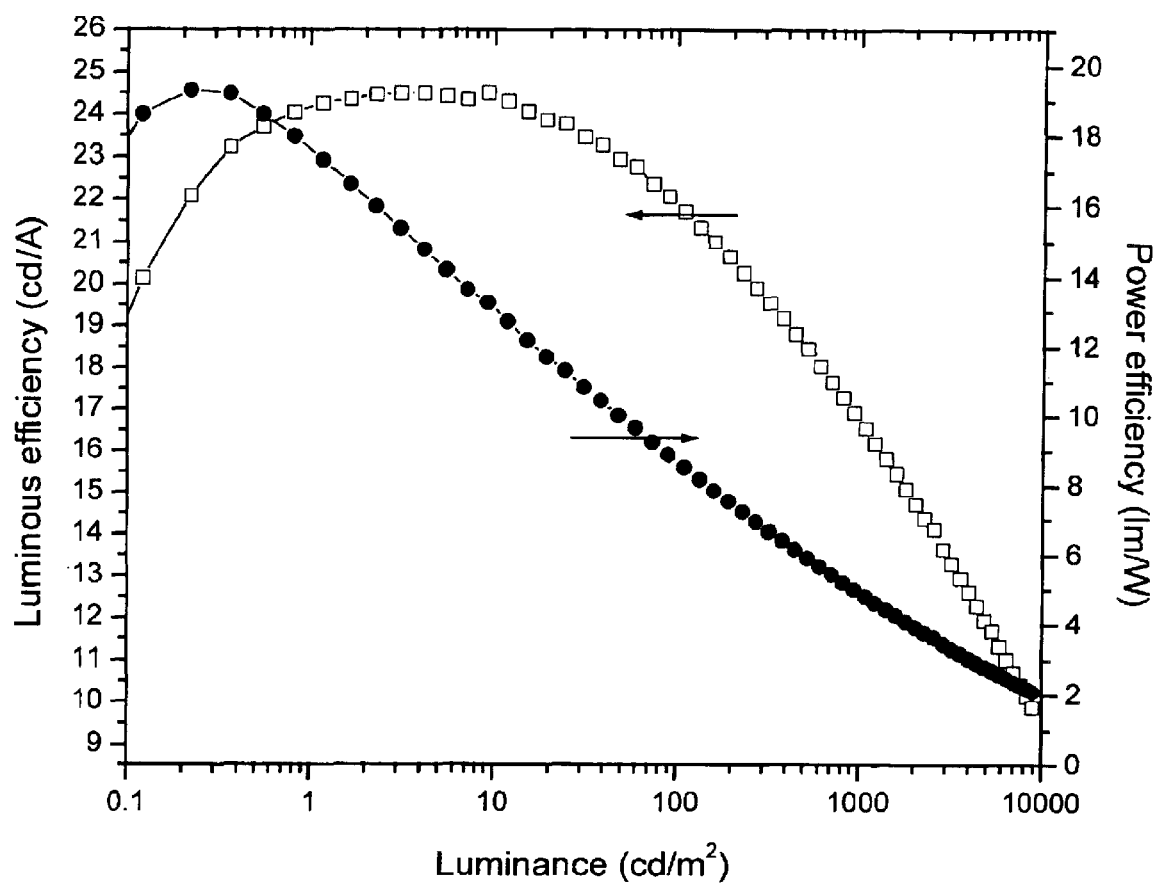
FIG. 5 shows the plots of luminous efficiency and power efficiency vs. luminance for a device of FIG. 3 were the Emissive Region has the structure CBP:Irppy(6%, 50 Å)/mCP:Ir($F_2$CNppy)$_2$(pic)(6%, 200 Å)/CBP:Ir(pq)$_2$(acac) (6%, 50 Å).

An OLED was prepared with the structure ITO/CuPc(100 Å)/NPD(300 Å)/CBP:Irppy(50 Å, 6%)/mCP:Ir($F_2$CNppy)$_2$(pic)(200 Å, 6%)/CBP:Ir(pq)$_2$(acac)(50 Å, 6%)/BAlq(400 Å)/LiF(5 Å)/Al(1000 Å). FIG. 4 shows the plots of the normalized emission spectra at various current densities for this device. FIG. 5 shows the plots of luminous efficiency and power efficiency vs. luminance for this device.

Example 2

Figure 6:
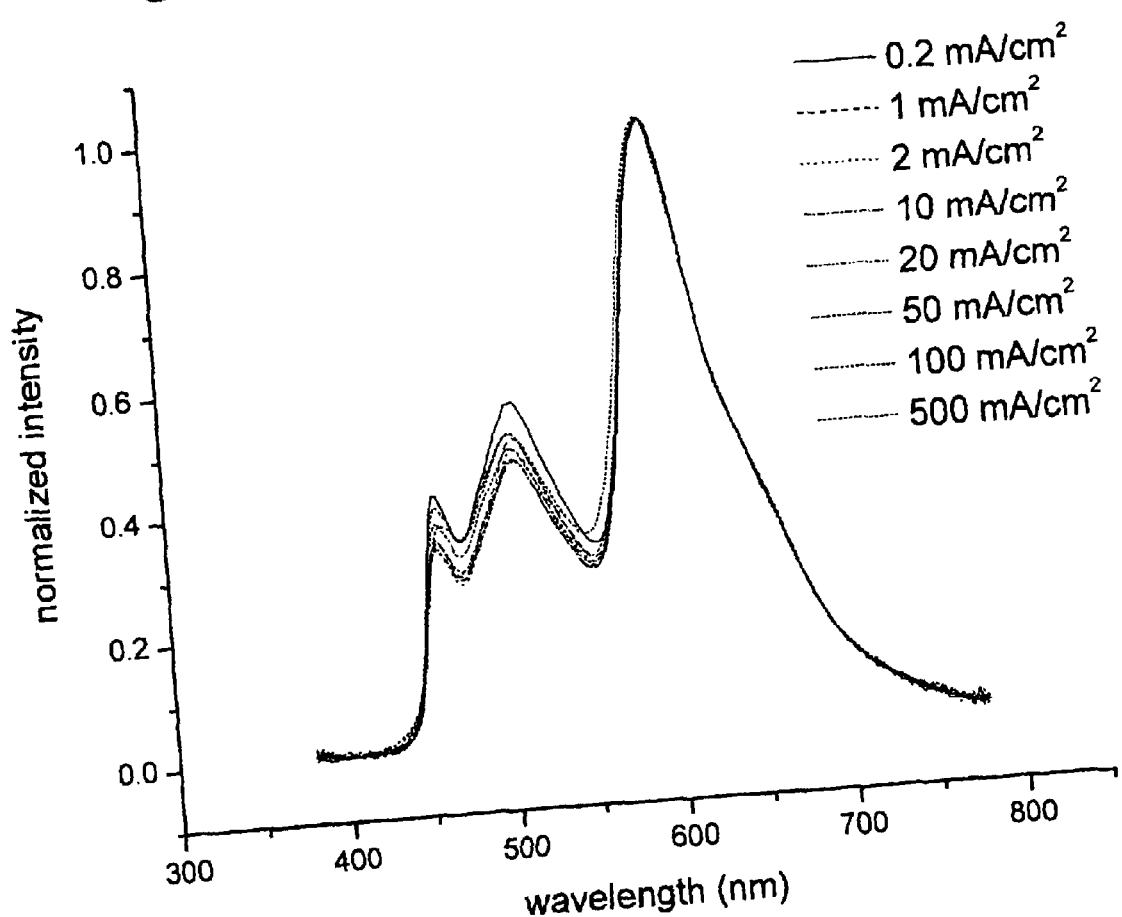
FIG. 6 shows the plots of the normalized emission spectra at various current densities for a device of FIG. 3 were the Emissive Region has the structure mCP:Ir($F_2$CNppy)$_2$(pic) (6%, 200 Å)/CBP:Ir(pq)$_2$(acac)(6%, 50 Å)/CBP:Irppy(6%, 50 Å).
Figure 7:
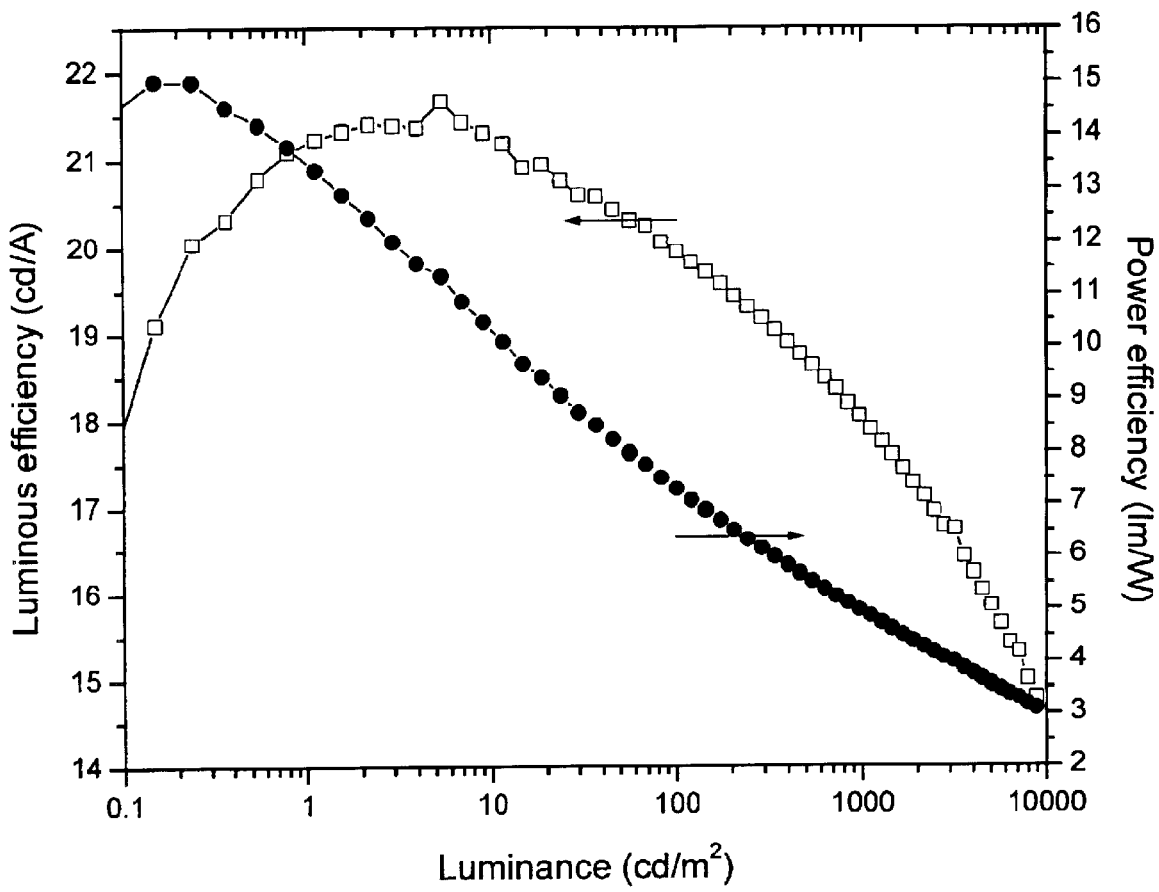
FIG. 7 shows the plots of luminous efficiency and power efficiency vs. luminance for a device of FIG. 3 were the Emissive Region has the structure mCP:Ir($F_2$CNppy)$_2$(pic) (6%, 200 Å)/CBP:Ir(pq)$_2$(acac)(6%, 50 Å)/CBP:Irppy(6%, 50 Å).

An OLED was prepared with the structure ITO/CuPc(100 Å)/NPD(300 Å)/mCP:Ir($F_2$CNppy)$_2$(pic)(200 Å, 6%)/CBP:Ir(pq)$_2$(acac)(50 Å, 6%)/CBP:Irppy (50 Å, 6%)/BAlq (400 Å)/LiF(5 Å)/Al(1000 Å). FIG. 6 shows the plots of the normalized emission spectra at various current densities for this device. FIG. 7 shows the plots of luminous efficiency and power efficiency vs. luminance for this device.

Example 3

Figure 8:
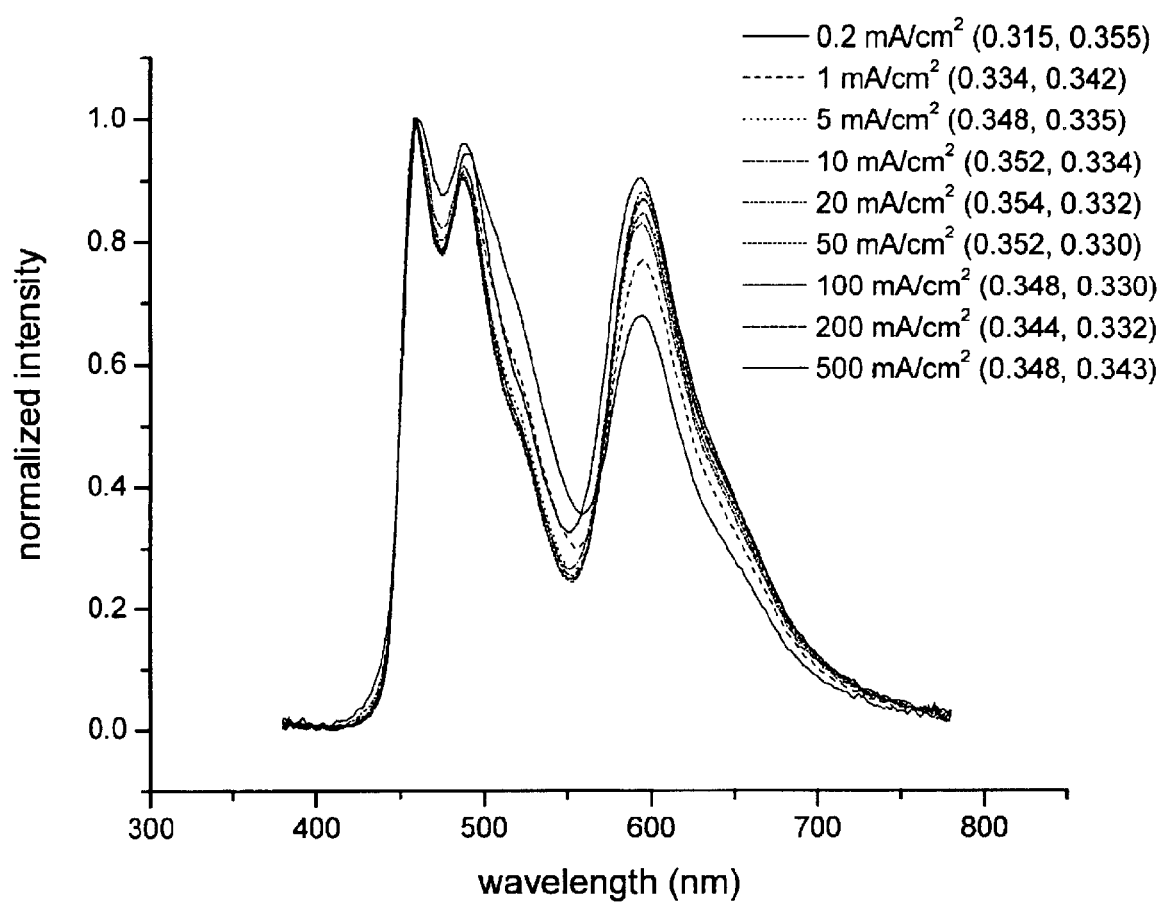
FIG. 8 shows the plots of the normalized emission spectra at various current densities for a device of FIG. 3 were the Emissive Region has the structure mCP:Irppy(6%, 50 Å)/mCP:Ir($F_2$CNppy)$_2$(pic)(6%, 225 Å)/CBP:Ir(pq)$_2$(acac) (6%, 25 Å).
Figure 9:
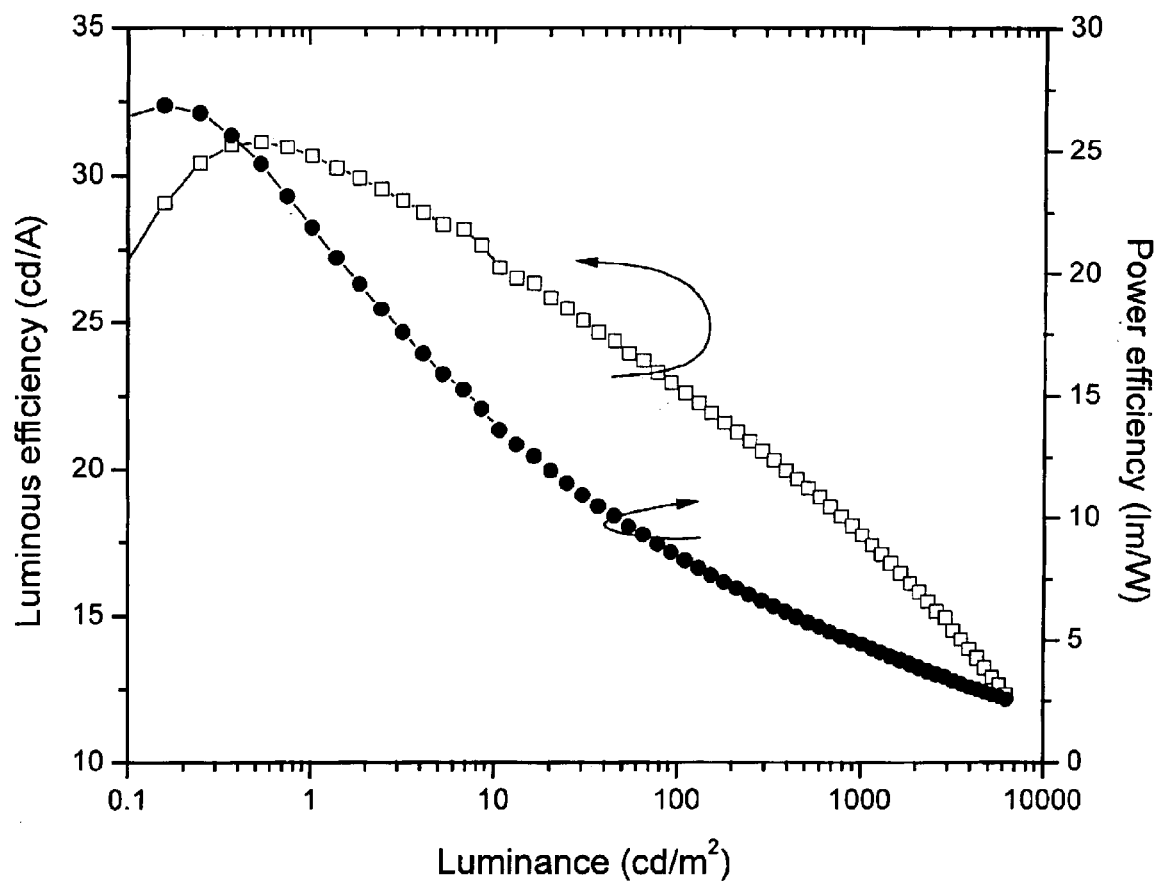
FIG. 9 shows the plots of luminous efficiency and power efficiency vs. luminance for a device of FIG. 3 were the Emissive Region has the structure mCP:Irppy(6%, 50 Å)/mCP:Ir($F_2$CNppy)$_2$(pic)(6%, 225 Å)/CBP:Ir(pq)$_2$(acac) (6%, 25 Å).

An OLED was prepared with the structure ITO/CuPc(100 Å)/NPD(300 Å)/mCP:Irppy(6%, 50 Å)/mCP:Ir($F_2$CNppy)$_2$(pic)(6%, 225 Å)/CBP:Ir(pq)$_2$(acac)(6%, 25 Å)/BAlq(400 Å)/LiF(5 Å)/Al(1000 Å). FIG. 8 shows the plots of the normalized emission spectra at various current densities for this device. FIG. 9 shows the plots of luminous efficiency and power efficiency vs. luminance for this device.

Example 4

Figure 10:
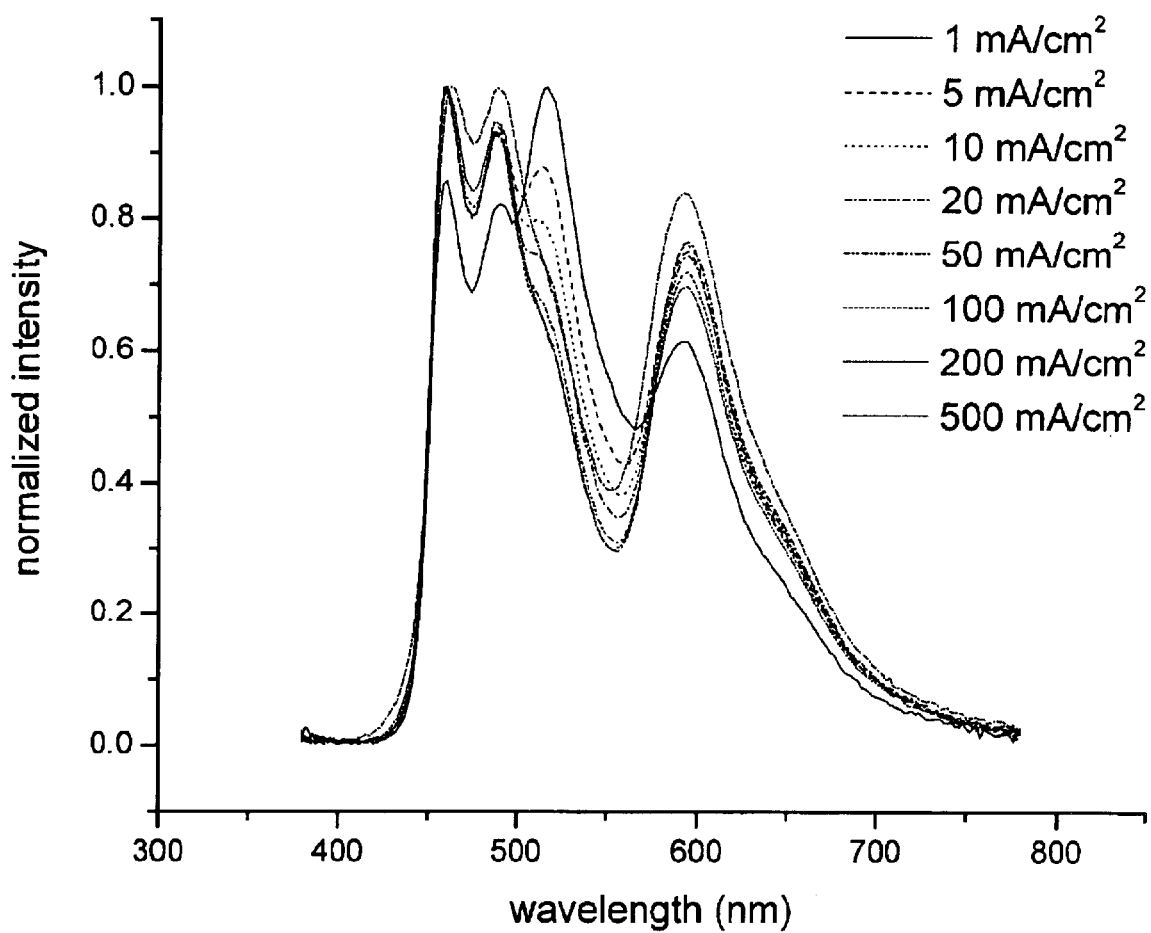
FIG. 10 shows the plots of the normalized emission spectra at various current densities for a device of FIG. 3 were the Emissive Region has the structure mCP:Ir (Ph-ppy)$_3$(6%, 50 Å)/mCP:Ir($F_2$CNppy)$_2$(pic)(6%, 225 Å)/CBP:Ir(pq)$_2$(acac)(6%, 25 Å).
Figure 11:
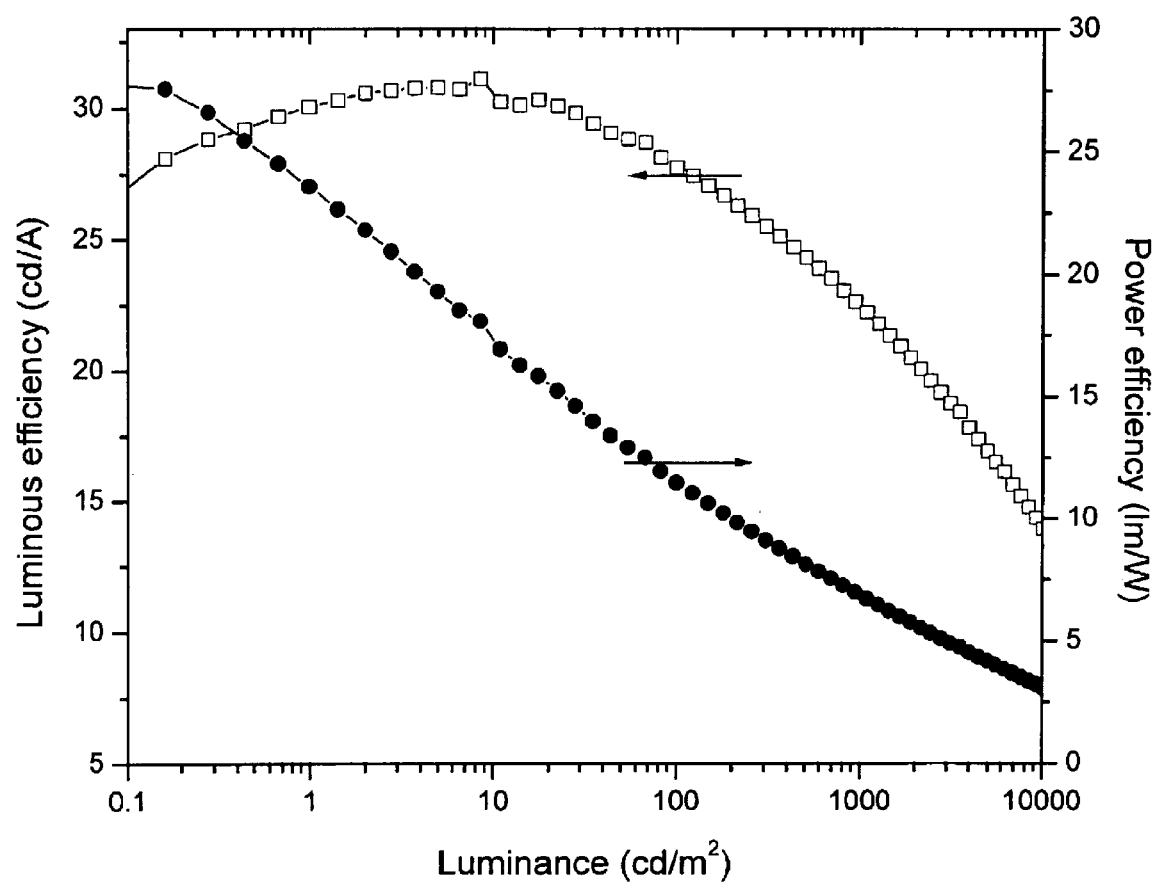
FIG. 11 shows the plots of luminous efficiency and power efficiency vs. luminance for a device of FIG. 3 were the Emissive Region has the structure mCP:Ir(Ph-ppy)$_3$(6%, 50 Å)/mCP:Ir($F_2$CNppy)$_2$(pic)(6%, 225 Å)/CBP:Ir(pq)$_2$(acac) (6%, 25 Å).

An OLED was prepared with the structure ITO/CuPc(100 Å)/NPD(300 Å)/mCP:Ir(Ph-ppy)$_3$(6%, 50 Å)/mCP:Ir($F_2$CNppy)$_2$(pic)(6%, 225 Å)/CBP:Ir(pq)$_2$(acac)(6%, 25 Å)/BAlq(400 Å)/LiF(5 Å)/Al(1000 Å). FIG. 10 shows the plots of the normalized emission spectra at various current densities for this device. FIG. 11 shows the plots of luminous efficiency and power efficiency vs. luminance for this device.

Example 5

Figure 12:
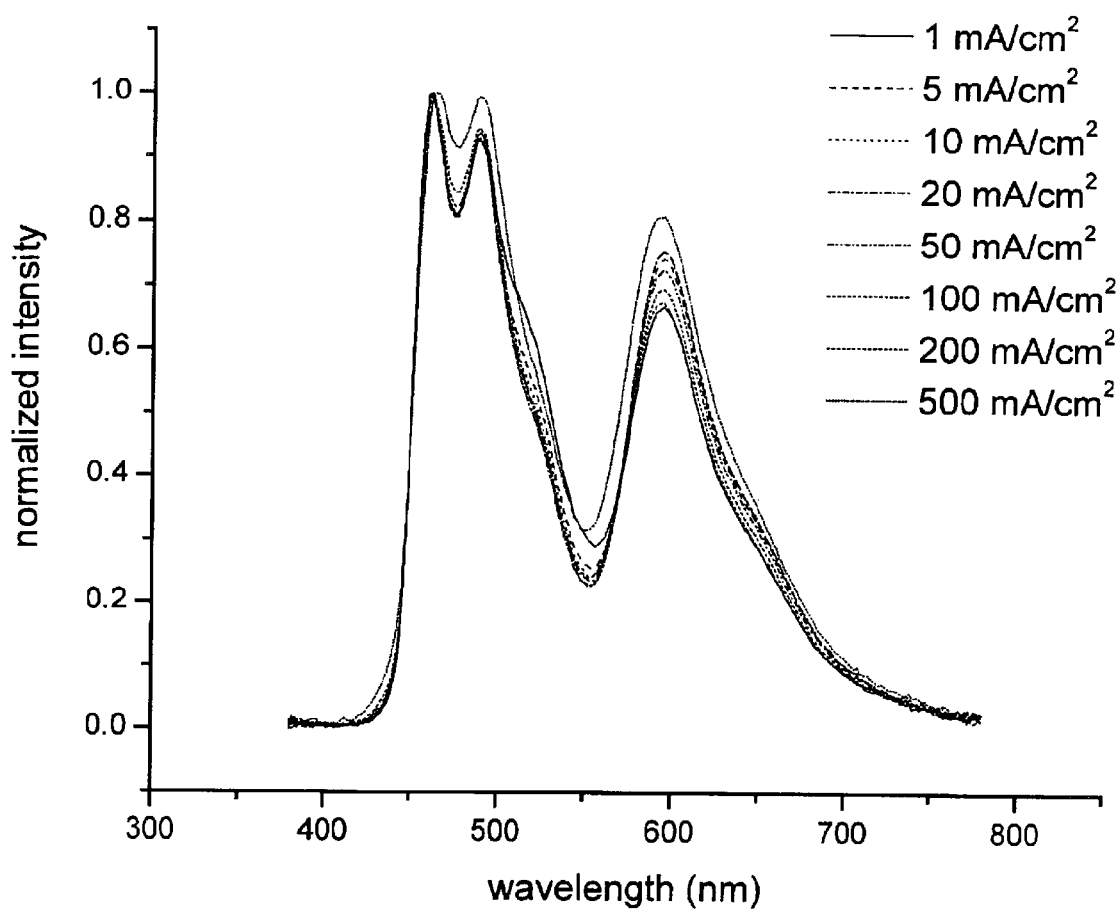
FIG. 12 shows the plots of the normalized emission spectra at various current densities for a device of FIG. 3 were the Emissive Region has the structure mCP:Ir (Ph-ppy)$_3$(6%, 25 Å)/mCP:Ir($F_2$CNppy)$_2$(pic)(6%, 250 Å)/CBP:Ir(pq)$_2$(acac)(6%, 25 Å).
Figure 13:
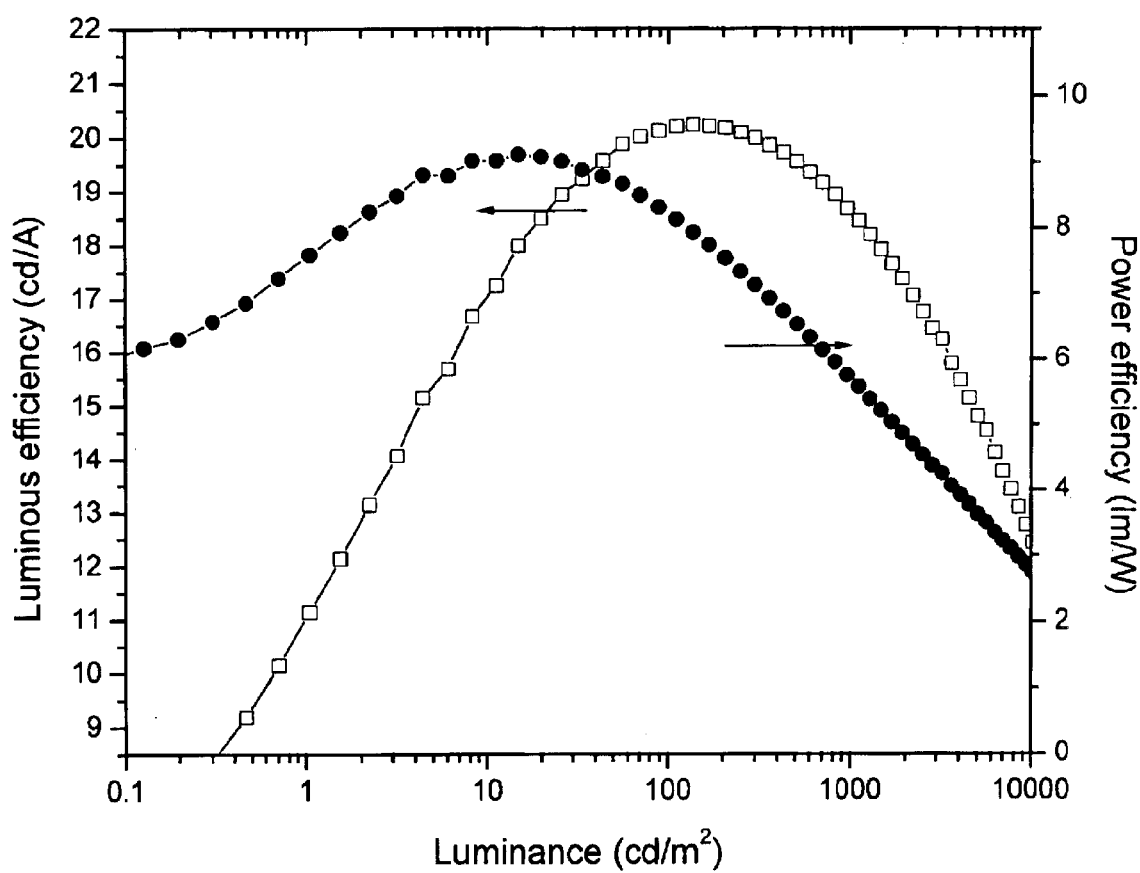
FIG. 13 shows the plots of luminous efficiency and power efficiency vs. luminance for a device of FIG. 3 were the Emissive Region has the structure mCP:Ir(Ph-ppy)$_3$(6%, 25 Å)/mCP:Ir($F_2$CNppy)$_2$(pic)(6%, 250 Å)/CBP:Ir(pq)$_2$(acac) (6%, 25 Å).

An OLED was prepared with the structure ITO/CuPc(100 Å)/NPD(300 Å)/mCP:Ir(Ph-ppy)$_3$(25)/mCP:Ir($F_2$CNppy)$_2$(Pic)(250)/CBP:Ir(pq)$_2$(acac)(25)/BAlq(400 Å)/LiF(5 Å)/Al (1000 Å). FIG. 12 shows the plots of the normalized emission spectra at various current densities for this device. FIG. 13 shows the plots of luminous efficiency and power efficiency vs. luminance for this device.

Example 6

Figure 14:
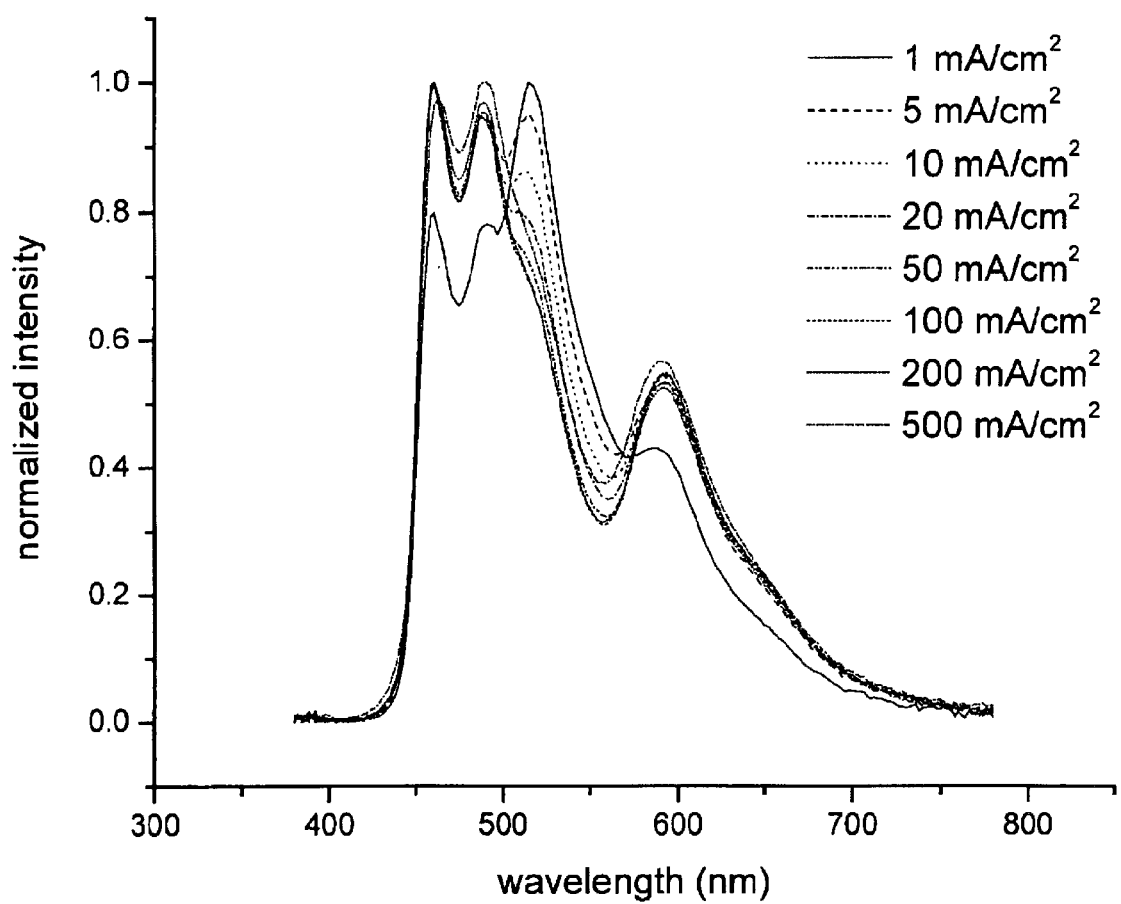
FIG. 14 shows the plots of the normalized emission spectra at various current densities for a device having the structure ITO/CuPc(100 Å)/NPD(300 Å)/mCP:Ir(Ph-ppy)$_3$ (6%, 50 Å)/mCP:Ir($F_2$CNppy)$_2$(pic)(6%, 225 Å)/CBP:Ir (pq)$_2$(acac)(6%, 25 Å)/BAlq(100 Å)/Alq(300 Å)/LiF/Al.
Figure 15:
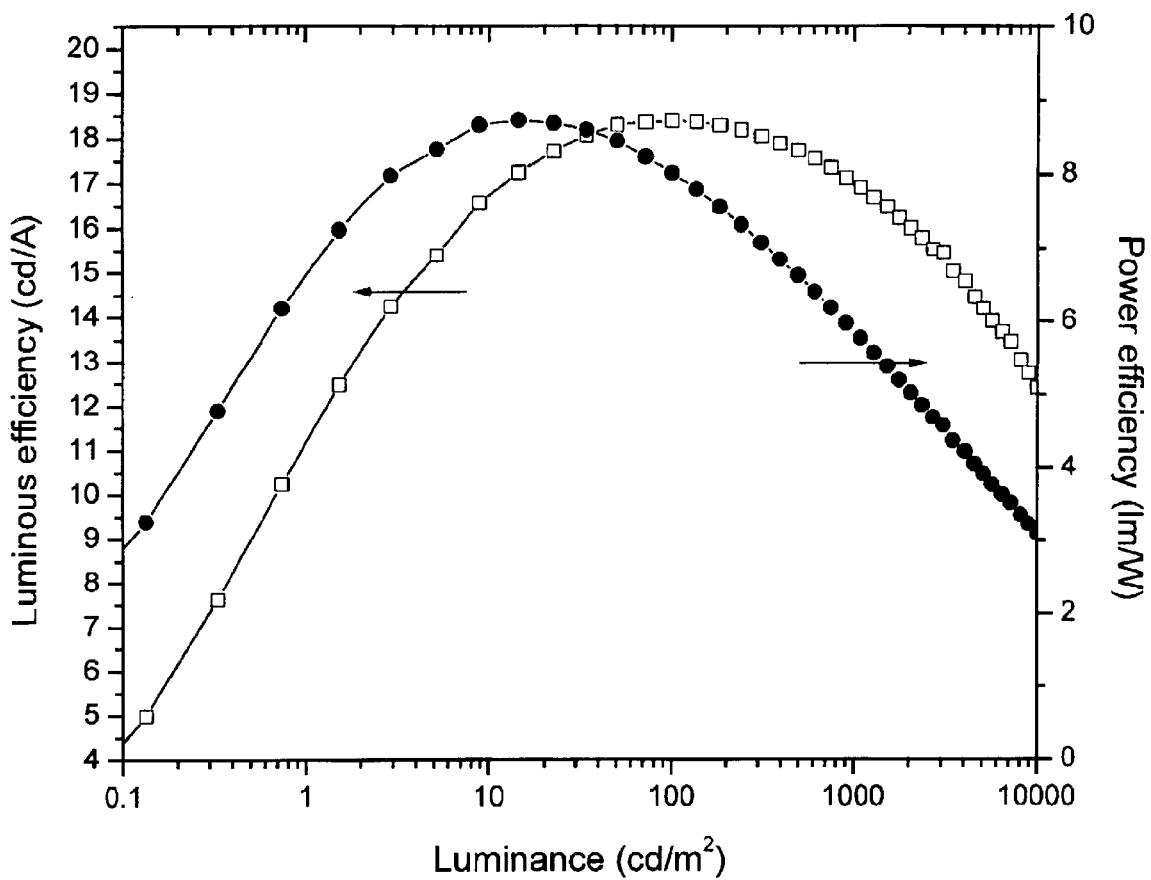
FIG. 15 shows the plots of luminous efficiency and power efficiency vs. luminance for a device having the structure ITO/CuPc(100 Å)/NPD(300 Å)/mCP:Ir(Ph-ppy)$_3$ (6%, 51 Å)/mCP:Ir($F_2$CNppy)$_2$(pic)(6%, 225 Å)/CBP:Ir(pq)$_2$(acac) (6%, 25 Å)/BAlq(100 Å)/Alq(300 Å)/LiF/Al.

An OLED was prepared with the structure ITO/CuPc(100 Å)/NPD(300 Å)/mCP:Ir(Ph-ppy)$_3$(50 Å)/mCP:Ir($F_2$CNppy)$_2$(pic)(225 Å)/CBP:Ir(pq)$_2$(acac)(25 Å)/BAlq(100 Å)/Alq(300 Å)/LiF/Al. FIG. 14 shows the plots of the normalized emission spectra at various current densities for this device. FIG. 15 shows the plots of luminous efficiency and power efficiency vs. luminance for this device.

Example 8

Figure 16:
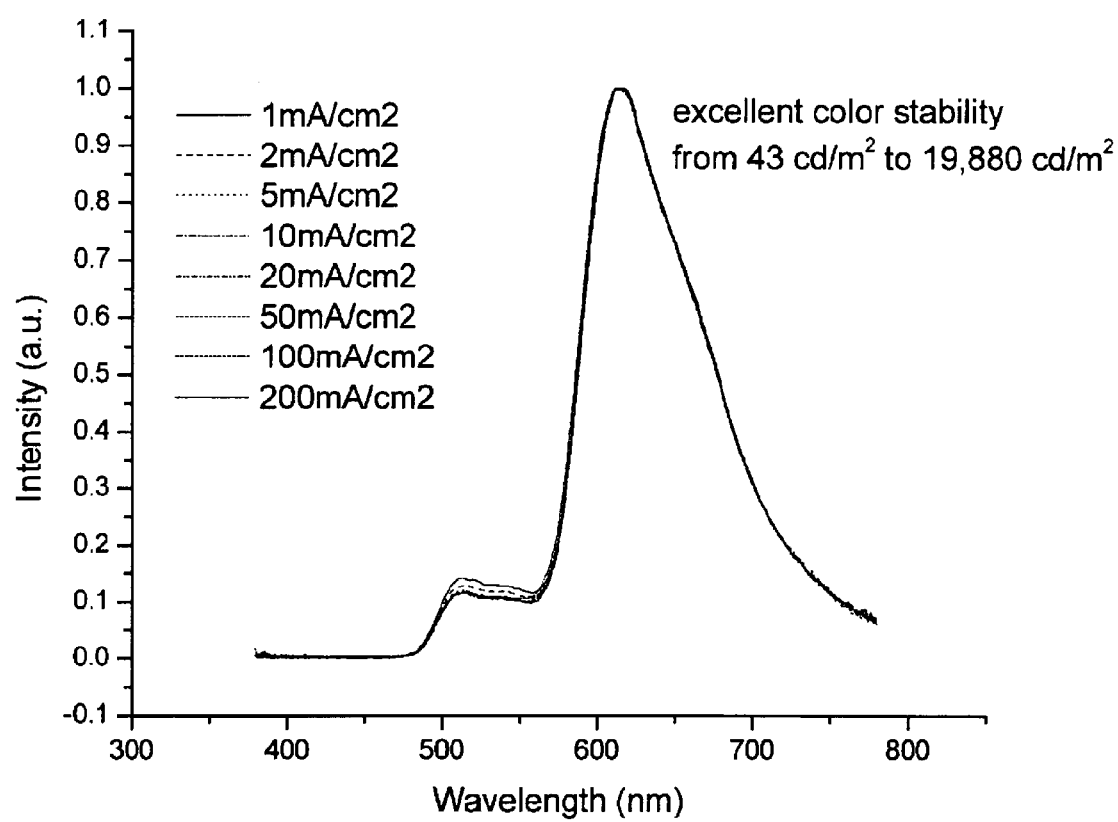
FIG. 16 shows the plots of the normalized emission spectra at various current densities for a device having the structure ITO/CuPc(100 Å)/NPD(400 Å)/CBP:Ir(Me-pq)$_2$ (acac) (150 Å, 6%)/TPBi:Irppy(150 Å, 6%)/BAlq(150 Å)/Alq(400 Å)/LiF/Al.

An OLED was prepared with the structure ITO/CuPc(100 Å)/NPD(400 Å)/CBP:Ir(Me-pq)$_2$(acac)(150 Å, 6%)/TPBi:Irppy(150 Å, 6%)/BAlq(150 Å)/Alq(400 Å)/LiF/Al. FIG. 16 shows the plots of the normalized emission spectra at various current densities for this device. This devices displays excellent color stability from 43 cd/m$^2$ to 19,880 cd/m$^2$.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. An organic light emitting device comprising:
   an emissive region disposed between and electrically connected to an anode and a cathode,
   wherein the emissive region comprises:
   a first emissive layer, comprising a first host material and a first emissive material, and
   a second emissive layer in physical contact with the first emissive layer and comprising a second host material and a second emissive material,
   wherein:
   the contact between the first emissive layer and the second emissive layer provides an electron injection barrier, a hole injection barrier, or both,
   the first emissive layer is nearer to the anode than the second emissive layer,
   at least one of the first emissive material or the second emissive material is a phosphorescent emissive material, and
   wherein the device emits with CIE x,y-coordinates that vary less than about 0.04 over the luminance range of about 1000 cd/m$^2$ to about 20,000 cd/m$^2$.

2. The organic light emitting device of claim 1, wherein the contact between the first emissive layer and the second emissive layer provides an electron injection barrier.

3. The organic light emitting device of claim 2, wherein the first emissive layer has a higher LUMO than the second emissive layer.

4. The organic light emitting device of claim 2, wherein the first emissive layer has a lower electron mobility than the second emissive layer.

5. The organic light emitting device of claim 1, wherein the contact between the first emissive layer and the second emissive layer provides a hole injection barrier.

6. The organic light emitting device of claim 5, wherein the second emissive layer has a lower HOMO than the first emissive layer.

7. The organic light emitting device of claim 2, wherein the second emissive layer has a lower hole mobility than the first emissive layer.

8. The organic light emitting device of claim 1, wherein the emissive region further comprises an additional emissive layer.

9. An organic light emitting device comprising:
an emissive region disposed between and electrically connected to an anode and a cathode,
wherein the emissive region comprises:
a first emissive layer, comprising a first host material and a first emissive material, and
a second emissive layer in physical contact with the first emissive layer and comprising a second host material and a second emissive material,
wherein:
the contact between the first emissive layer and the second emissive layer provides an electron injection barrier, a hole injection barrier, or both,
the first emissive layer is nearer to the anode than the second emissive layer,
at least one of the first emissive material or the second emissive material is a phosphorescent emissive material, and
wherein the device emits with CIE x,y-coordinates that vary less than about 0.02 over the luminance range of about 1000 cd/m$^2$ to about 20,000 cd/m$^2$.

10. An organic light emitting device comprising:
an emissive region disposed between and electrically connected to an anode and a cathode,
wherein the emissive region comprises:
a first emissive layer, comprising a first host material and a first emissive material, and
a second emissive layer in physical contact with the first emissive layer and comprising a second host material and a second emissive material,
wherein:
the contact between the first emissive layer and the second emissive layer provides an electron injection barrier, a hole injection barrier, or both,
the first emissive layer is nearer to the anode than the second emissive layer,
at least one of the first emissive material or the second emissive material is a phosphorescent emissive material, and
wherein the device emits with CIE x,y-coordinates that vary less than about 0.01 over the luminance range of about 1000 cd/m$^2$ to about 20,000 cd/m$^2$.

11. An organic light emitting device comprising:
an emissive region disposed between and electrically connected to an anode and a cathode,
wherein the emissive region comprises:
a first emissive layer, comprising a first host material and a first emissive material, and
a second emissive layer in physical contact with the first emissive layer and comprising a second host material and a second emissive material,
wherein:
the contact between the first emissive layer and the second emissive layer provides an electron injection barrier, a hole injection barrier, or both,
the first emissive layer is nearer to the anode than the second emissive layer,
at least one of the first emissive material or the second emissive material is a phosphorescent emissive material, and
wherein the device emits with CIE x,y-coordinates that vary less than about 0.04 over the luminance range of about 50 cd/m$^2$ to about 50,000 cd/m$^2$.

12. An organic light emitting device comprising:
an emissive region disposed between and electrically connected to an anode and a cathode,
wherein the emissive region comprises:
a first emissive layer, comprising a first host material and a first emissive material, and
a second emissive layer in physical contact with the first emissive layer and comprising a second host material and a second emissive material,
wherein:
the contact between the first emissive layer and the second emissive layer provides an electron injection barrier, a hole injection barrier, or both,
the first emissive layer is nearer to the anode than the second emissive layer,
at least one of the first emissive material or the second emissive material is a phosphorescent emissive material, and
wherein the device emits with CIE x,y-coordinates that vary less than about 0.02 over the luminance range of about 50 cd/m$^2$ to about 50,000 cd/m$^2$.

13. An organic light emitting device comprising:
an emissive region disposed between and electrically connected to an anode and a cathode,
wherein the emissive region comprises:
a first emissive layer, comprising a first host material and a first emissive material, and
a second emissive layer in physical contact with the first emissive layer and comprising a second host material and a second emissive material,
wherein:
the contact between the first emissive layer and the second emissive layer provides an electron injection barrier, a hole injection barrier, or both,
the first emissive layer is nearer to the anode than the second emissive layer,
at least one of the first emissive material or the second emissive material is a phosphorescent emissive material, and
wherein the device emits with CIE x,y-coordinates that vary less than about 0.01 over the luminance range of about 50 cd/m$^2$ to about 50,000 cd/m$^2$.

14. The organic light emitting device of claim 1, wherein the first emissive material and the second emissive material are phosphorescent emissive materials.

15. The organic light emitting device of claim 1, wherein the first host material is a high energy gap material and the first emissive material is a phosphorescent blue-emitting material.

16. The organic light emitting device of claim 1, wherein the second host material is a high energy gap material and the second emissive material is a phosphorescent blue-emitting material.

17. The organic light emitting device of claim 1, wherein the first host material is mCP and the second host material is CBP.

* * * * *

UNITED STATES PATENT AND TRADEMARK OFFICE
CERTIFICATE OF CORRECTION

PATENT NO. : 6,885,025 B2
DATED : April 26, 2005
INVENTOR(S) : Tung et al.

It is certified that error appears in the above-identified patent and that said Letters Patent is hereby corrected as shown below:

Column 3,
Line 14, delete "100121"; and

Column 15,
Line 13, change "irraditated" to -- irradiated --.

Signed and Sealed this

Eighteenth Day of October, 2005

JON W. DUDAS
*Director of the United States Patent and Trademark Office*